US006224418B1

(12) United States Patent
Miura et al.

(10) Patent No.: US 6,224,418 B1
(45) Date of Patent: May 1, 2001

(54) ELECTRICAL CONNECTOR FOR FLEXIBLE PRINTED BOARD

(75) Inventors: Kazuto Miura; Taichiro Miyao, both of Kanagawa; Shinji Uchida, Tokyo, all of (JP)

(73) Assignee: J.S.T. Msf. Co., Ltd., Osaka (JP)

( * ) Notice: Subject to any disclaimer, the term of this patent is extended or adjusted under 35 U.S.C. 154(b) by 0 days.

(21) Appl. No.: 09/558,547

(22) Filed: Apr. 26, 2000

(30) Foreign Application Priority Data

Apr. 30, 1999 (JP) ........................ 11-124565

(51) Int. Cl.[7] .................. H01R 12/24; H01R 13/15; H01R 12/00; H01R 13/62; H05K 1/00

(52) U.S. Cl. .................. 439/495; 439/260; 439/329; 439/467; 439/73; 439/331

(58) Field of Search .................. 439/495, 260, 439/329, 596, 467, 73, 331

(56) References Cited

U.S. PATENT DOCUMENTS 5,401,186 * 3/1995 Nozaki et al. .................. 439/495
5,474,468 * 12/1995 Chishima et al. .................. 439/495
5,904,586 * 5/1999 Takayasu .................. 439/260
5,911,597 * 6/1999 Oshitani .................. 439/495
6,056,572 * 5/2000 Matsumoto et al. .................. 439/260
6,089,905 * 7/2000 Shimmyo et al. .................. 439/495
6,116,947 * 9/2000 Takayasu .................. 439/495
6,126,466 * 10/2000 Inadama .................. 439/260

* cited by examiner

*Primary Examiner*—Paula Bradley
*Assistant Examiner*—Edwin A. León
(74) *Attorney, Agent, or Firm*—Rader, Fishman & Grauer

(57) ABSTRACT

An electrical connector for flexible printed board includes a housing with an opening, and a cover rotatable about a pivotal axis for closing or opening the opening. When the cover is closed, a pressure portion disposed along one edge of the cover is clamped between a flexible printed board on a resilient piece of a fork-shaped contact and a fixing piece of the contact while pressing the flexible printed board against the resilient piece. A wire fixed within the cover includes a pair of opposite ends projecting from lateral sides of the cover along the pivotal axis, and an intermediate portion circumventing the pressure portion as spaced a distance from the pivotal axis.

8 Claims, 11 Drawing Sheets

ELECTRICAL CONNECTOR FOR FLEXIBLE PRINTED BOARD

CROSS REFERENCE TO RELATED APPLICATION

This application claims the benefit under 35 U.S.C. §119 of Japanese Patent Application No.11-124565 filed on Apr. 30, 1999, the abstract of disclosure of which is incorporated herein by reference.

BACKGROUND OF THE INVENTION

1. Field of the Invention

The present invention relates to an electrical connector for flexible printed board called FPC (Flexible printed board).

2. Description of Related Art

There has been known to the art the connector of this type which includes a synthetic-resin housing having an opening adapted to open upward, a plurality of fork-shaped contacts which are arranged to face the opening of the housing and each of which has a fixing piece and a resilient piece in vertically opposed relation, and a synthetic-resin cover adapted to open/close the opening of the housing.

The cover is integrally formed with a pair of support shafts as resin projections at opposite ends of one edge thereof. As born on pivotal support portions of the housing (or members retained by the housing), these support shafts permit the cover to pivot between an opened position and a closed position.

An alternative arrangement is made such that support shafts provided at the housing are fitted in U-shaped notches of the cover thereby to support the cover in the pivotal movement. The support shafts may be formed of resin as an integral part of the housing or may be composed of metal pins independent from the housing (see, for example, Japanese Utility Model Laid-Open Gazette No. 6-77186).

The cover is provided with a pressure portion at one edge thereof. When the cover is moved to the closed position, the pressure portion is clamped between a flexible printed board on the resilient pieces and the fixing pieces while pressing the flexible printed board against the resilient pieces.

In this case, the fixing pieces of the contacts receive a resilient counter force from the resilient pieces of the contacts via the FPC and the pressure portion. However, it is relatively easy to secure a contact pressure between the FPC and the resilient pieces because the contacts are formed of metallic members, the fixing pieces of which have high rigidity.

However, the cover has been decreased in thickness in order to satisfy the recent demand for connectors with smaller height. Thus, the cover is more susceptible to deformation such as warpage. When warpage occurs in the cover, the plural contacts contact the FPC at non-uniform pressures so that some of the contacts suffer instable electrical continuity. Where the pivot shafts are formed of resin as the integral part of the housing or cover, a fear exists in the connector assembly process that the pivot shaft may break when fitted into the pivotal support portion.

SUMMARY OF THE INVENTION

In view of the foregoing, it is an object of the invention to provide an electrical connector for flexible printed board which is less prone to breakages, presents high contact pressure on the FPC and achieves height reduction.

For achieving the above object, an electrical connector for flexible printed board of a preferred mode of the invention is provided, which comprises a synthetic-resin housing having an opening, a plurality of fork-shaped contacts which are arranged to face the opening and each of which has a fixing piece and a resilient piece in vertically opposed relation, and a synthetic-resin cover rotatable around a predetermined pivotal axis to open/close the opening of the housing. The electrical connector for flexible printed board further comprises a pressure portion which is disposed at one edge of the cover, the edge being close to the predetermined pivotal axis and which, with the cover closed, is clamped between a flexible printed board on the resilient pieces and the fixing pieces while pressing the flexible printed board against the resilient pieces, and a metallic wire which is partially embedded in the cover during the molding of the cover.

The wire includes a pair of opposite ends and an intermediate portion between the opposite ends. The pair of opposite ends project from lateral sides of the cover along the predetermined pivotal axis and are supported by corresponding pivotal support portions. The intermediate portion is spaced from the predetermined pivotal axis and is at least partially embedded in the cover during the molding of the cover.

According to the mode of the invention, the opposite ends of the metallic wire serve as the pivot shafts of the cover, which are rigid. Since the deflection of the cover is prevented by the metallic wire extended through a width thereof, a sufficient contact pressure is attained between the FPC and the resilient pieces while the cover is prevented from disengaging from the housing. Further, the intermediate portion of the wire is spaced a distance from one edge of the cover where the pressure portion exists, so that the pressure portion may be decreased in thickness. This permits a small distance between the fixing piece and the resilient piece. As a result, the height of the connector can be decreased to, for example, about 1.3 mm. Since the wire is inserted in the cover during the resin molding thereof, the wire has such a high adhesion to the cover that the deformation of the cover is more positively prevented.

DETAILED DESCRIPTION OF THE PREFERRED EMBODIMENTS

Now, preferred embodiments of the invention will be described with reference to the accompanying drawings.

Figure 1:
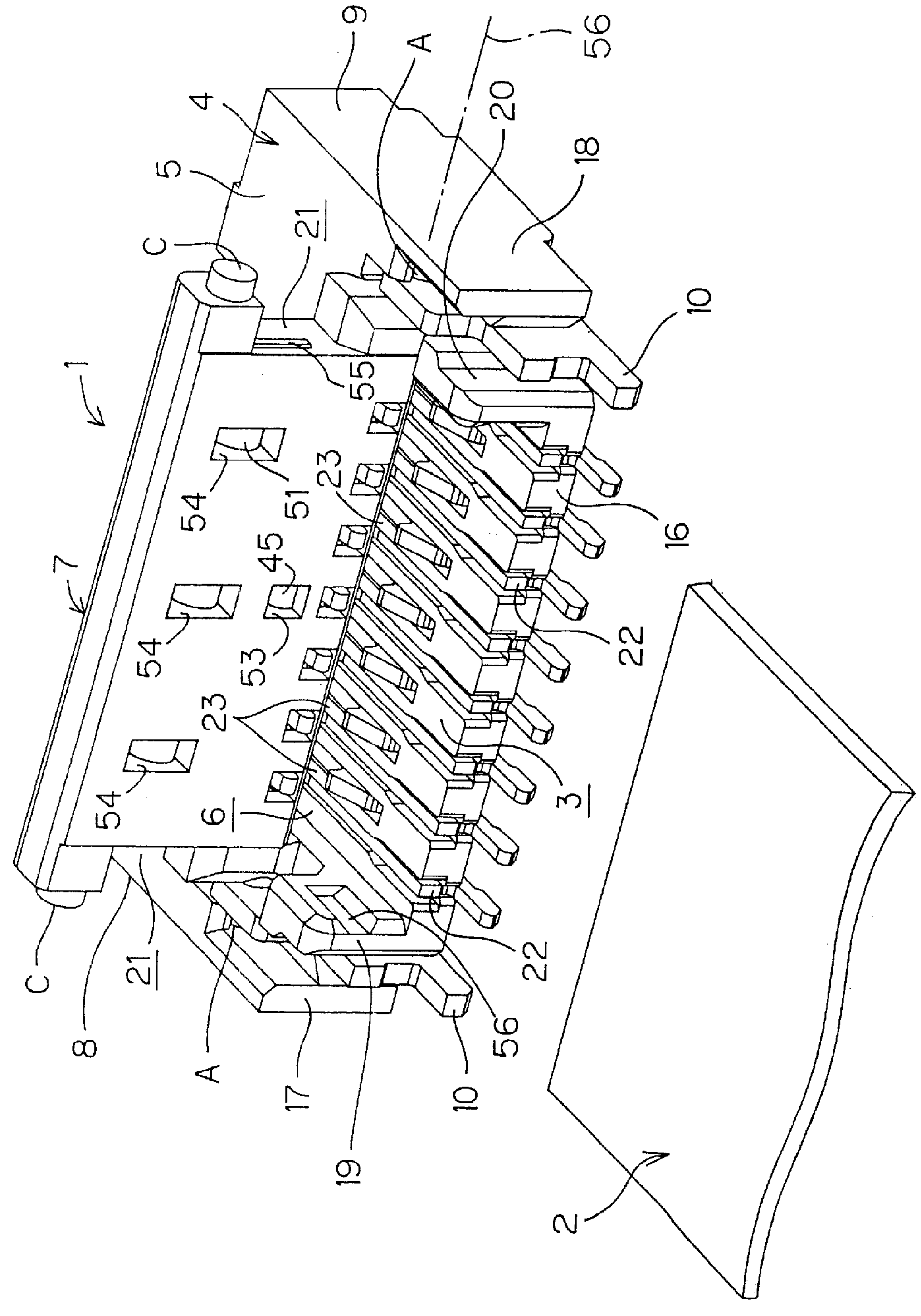
FIG. 1 is an exploded perspective view showing an FPC connector according to one embodiment of the invention and an FPC.
Figure 2:
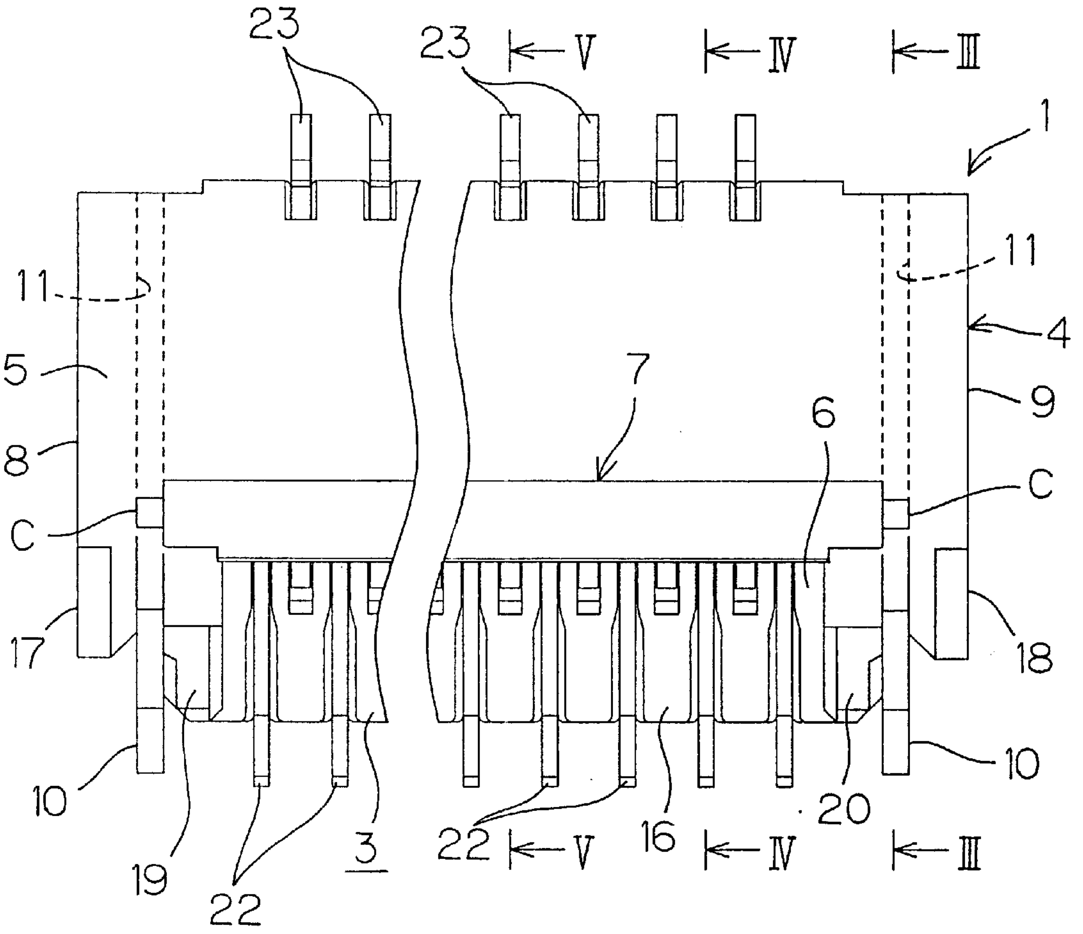
FIG. 2 is a partially cutaway plan view showing the connector with a cover opened.

Referring to FIGS. 1 and 2, an electrical connector for flexible printed board 1 (hereinafter, simply referred to as "connector 1") according to one embodiment of the invention includes a synthetic-resin housing 4 defining an insertion space 3 where a flexible printed board 2 (hereinafter, simply referred to as "FPC 2") is inserted from front or removed. A front half portion of the housing 4 upwardly opens via an opening 6 of a top plate 5 of the housing 4 and is provided with a cover 7, a molded article of synthetic resin, which is pivotally movable to open or close the opening 6.

Indicated at 51 is a metallic wire as a first reinforcement member embedded in the cover 7. Opposite ends of the wire 51 include a pair of locking projections C, as a first engagement portion. Each locking projection C locks in a lock notch 50, as a second engagement portion, of a corresponding reinforcement tab 10 formed of a metal sheet, as a second reinforcement member fixed to the housing 4, thereby locking the cover 7 in closed position. The locking projections C of the wire 51 and the lock notches 50 constitute a locking mechanism.

Indicated at 45 is a metallic wire, as a third reinforcement member, embedded in the cover 7. Opposite ends of the wire 45 include a pair of pivot shafts A. Openings 53, 54 are defined in the cover 7 for exposing respective parts of the corresponding wires 45, 51 as exposures 58, 59 to the outside of the cover 7.

Opposite side plates 8, 9 of the housing 4 define lateral sides of the insertion space 3. A pair of fixing holes 11 open to respective front end faces of the side plates 8, 9 (not shown in FIG. 1 but illustrated in FIG. 2 and FIG. 3 which is a sectional view taken on the line III—III in FIG. 2). The fixing holes 11 respectively receive from front and fix the reinforcement tabs 10 which support the pair of pivot shafts A projecting laterally of the cover 7, respectively.

Figure 3:
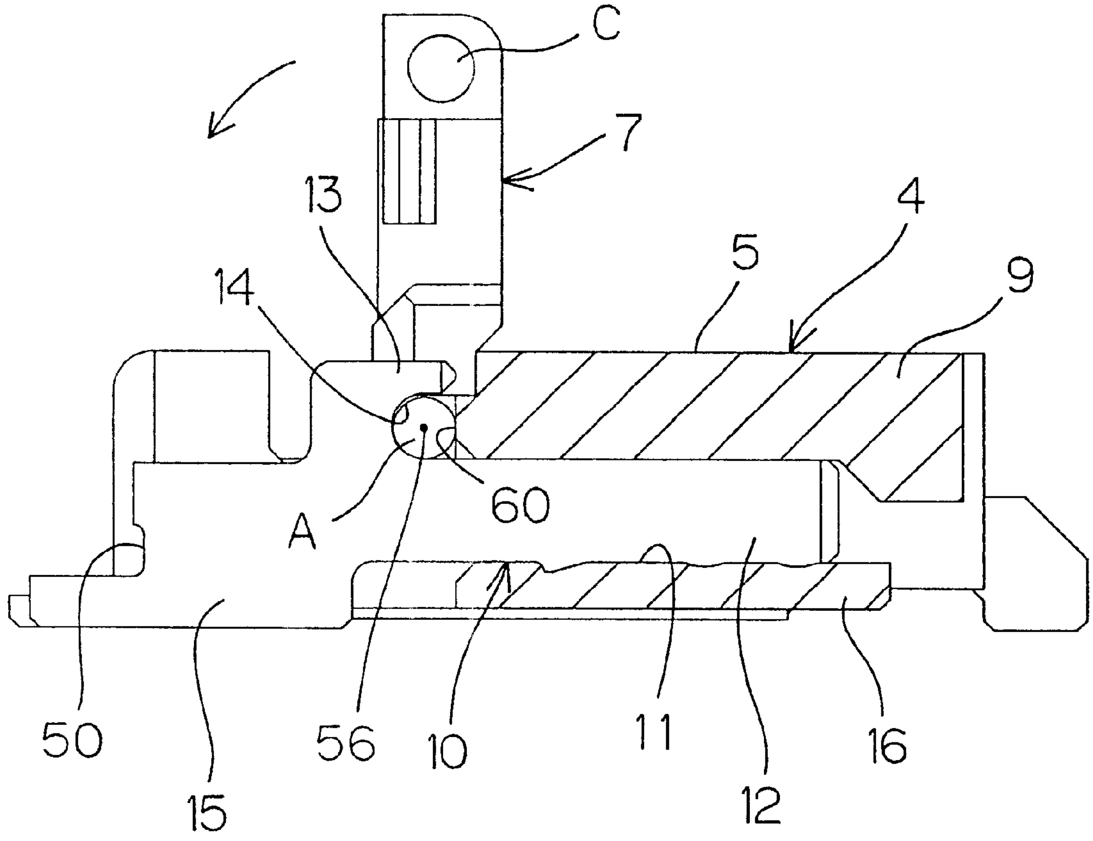
FIG. 3 is a sectional view taken on the line III—III in FIG. 2 and omits the hatching of an area representing the section of a reinforcement tab.

Referring to FIG. 3, the reinforcement tab 10 includes a main body 12, a pivotal support portion 14 for supporting the pivot shaft A and a hook-shaped fixing portion 15 soldered to a substrate surface. The main body 12 is inserted into the fixing hole 11 from front so as to be fixed via a locking projection. The pivotal support portion 14 is comprised of a U-shaped notch defined by an extension piece 13 extending upward from a front end of the main body 12. The pivotal support portion 14 pivotally supports the corresponding pivot shaft A. The fixing portion 15 extends downward from the front end of the main body 12.

A front portion of the main body 12 is defined with the aforesaid lock notch 50 serving to lock the cover 7 in the closed position through engagement with the locking projection C. An abutting portion 60 of the housing 4 is abutted against the pivot shaft A received by the U-shaped notch as the pivotal support portion 14, thereby retaining the pivot shaft A in the U-shaped notch.

Turning back to FIGS. 1 and 2, the side plates 8, 9 are formed with extensions 17, 18 extended forward, respectively. The extensions 17, 18 have a smaller thickness than the side plates 8, 9. The extensions 17, 18 are located laterally outside of the neighboring fixing holes 11, extending to some point of the lateral sides of the opening 6. Guide walls 19, 20 upstand from opposite side edges of a front portion of a bottom plate 16 of the housing 4. When the cover 7 is closed, the guide walls 19, 20 are received by corresponding U-shaped gaps 21 defined at lateral edges of the cover 7, thereby restricting the lateral movement of the cover 7.

Within the insertion space 3 of the housing 4, a plurality of first and second fork-shaped contacts 22, 23 are arranged in two rows in a zigzag fashion.

Figure 4:
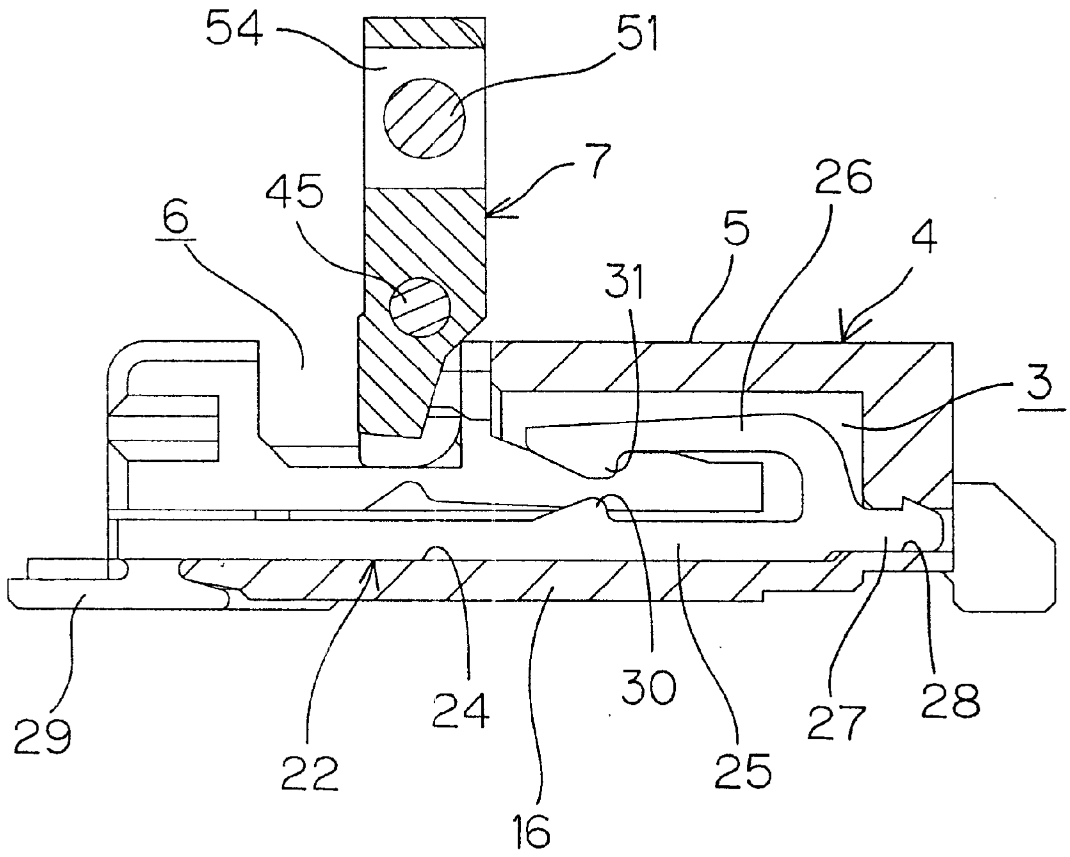
FIG. 4 is a sectional view taken on the line IV—IV in FIG. 2 and omits the hatching of an area representing the section of a first contact.

Referring to FIGS. 1, 2 and 4 which is a sectional view taken on the line IV—IV in FIG. 2, the first contact 22 is comprised of a metallic member which is inserted, from front, into the insertion space 3 of the housing 4 and fixed. As seen in FIG. 4, the first contact 22 includes a fixing piece 25 inserted, from front, into a receiving groove 24 defined in an upper surface of the bottom plate 16 of the housing 4, and a resilient piece 26 located above the fixing piece 25 in a rear half portion of the insertion space 3.

A locking piece 27 with a locking projection extends rearwardly from an interconnection between the fixing piece 25 and the resilient piece 26. The locking piece 27 is inserted into a fixing hole 28 of the housing 4 and fixed. The fixing piece 25 is provided with a lead portion 29 of inverted T-form at its front end. The lead portion 29 is soldered to the substrate surface on which the present connector 4 is mounted, while engaging a front edge of the bottom plate 16 of the housing 4 for preventing the upward dislocation of the fixing piece 25. Chevron-shaped projections 30, 31 are formed at the fixing piece 25 and the resilient piece 26 in opposed relation, for clamping the inserted FPC 2 therebetween thereby to ensure a contact pressure on the FPC 2.

Figure 5:
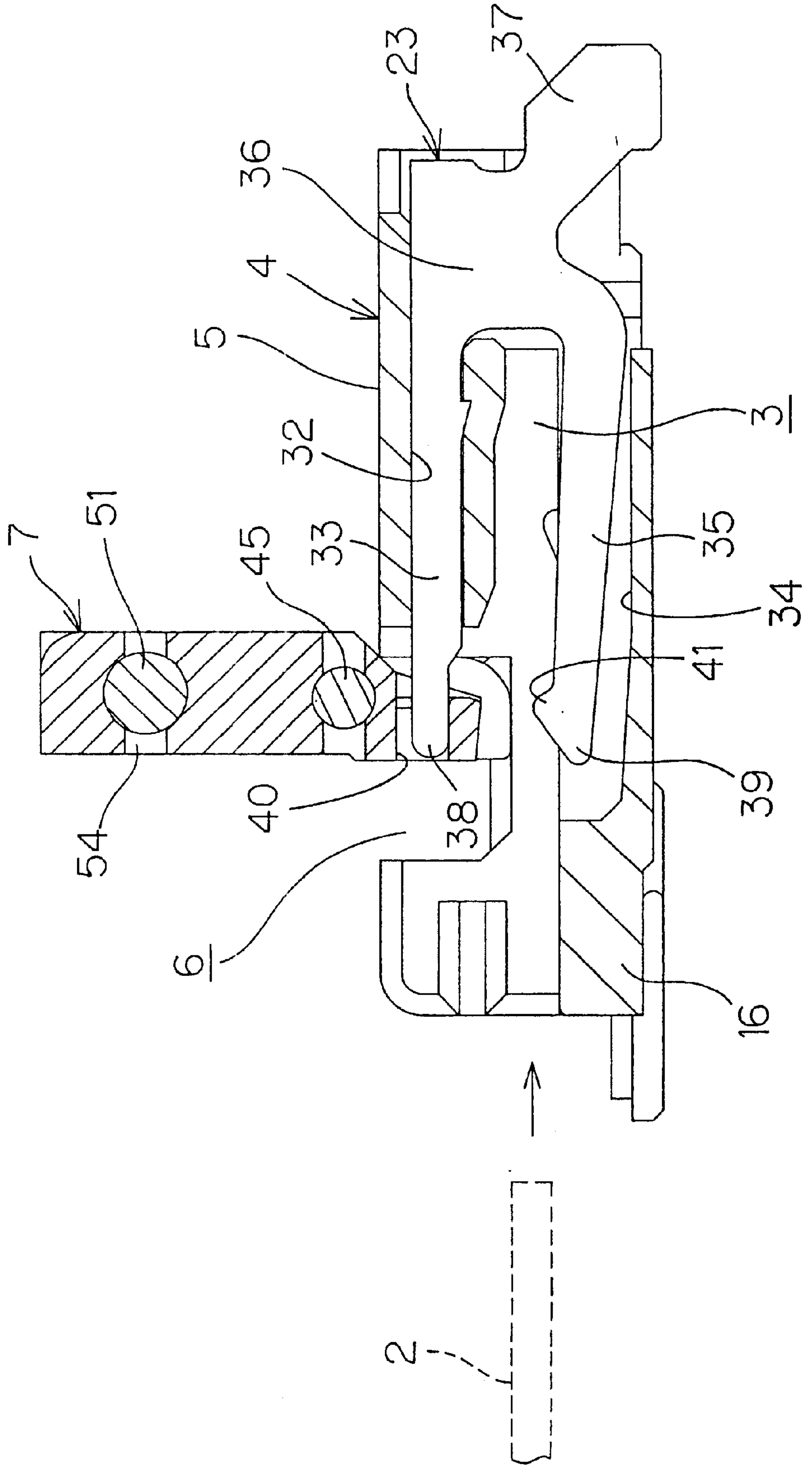
FIG. 5 is a sectional view taken on the line V—V in FIG. 2 and omits the hatching of an area representing the section of a second contact.

Referring to FIGS. 1, 2 and 5 which is a sectional view taken on the line V—V in FIG. 2, the second contact 23 is comprised of a metallic member which is inserted, from rear, into the insertion space 3 of the housing 4 and fixed. As seen in FIG. 5, the second contact 23 includes a fixing piece 33 with a locking projection, a resilient piece 35 located below the fixing piece 33, a main body 36 and a lead portion 37.

The fixing piece 33 is inserted, from rear, into a fixing hole 32 at an upper part of the housing 4 and fixed. The resilient piece 35 is inserted, from rear, into a receiving groove 34 defined in the upper surface of the bottom plate 16 of the housing 4. The main body 36 interconnects rear ends of the fixing piece 33 and the resilient piece 35. The lead portion 37 extends rearward from the main body 36 in an obliquely downward direction and is soldered to the substrate surface.

Figure 6:
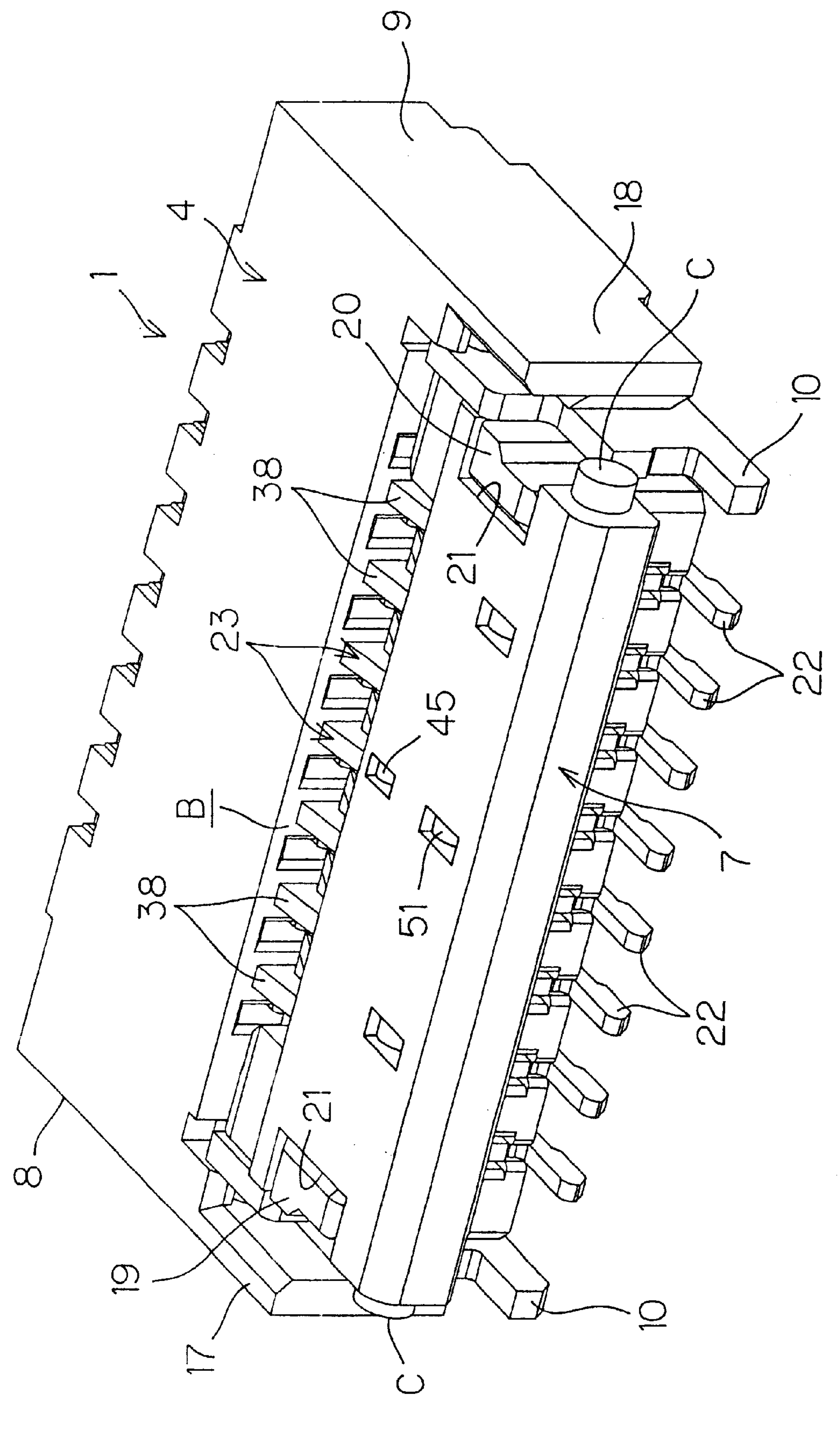
FIG. 6 is a perspective view showing the connector with the cover almost closed.
Figure 9:
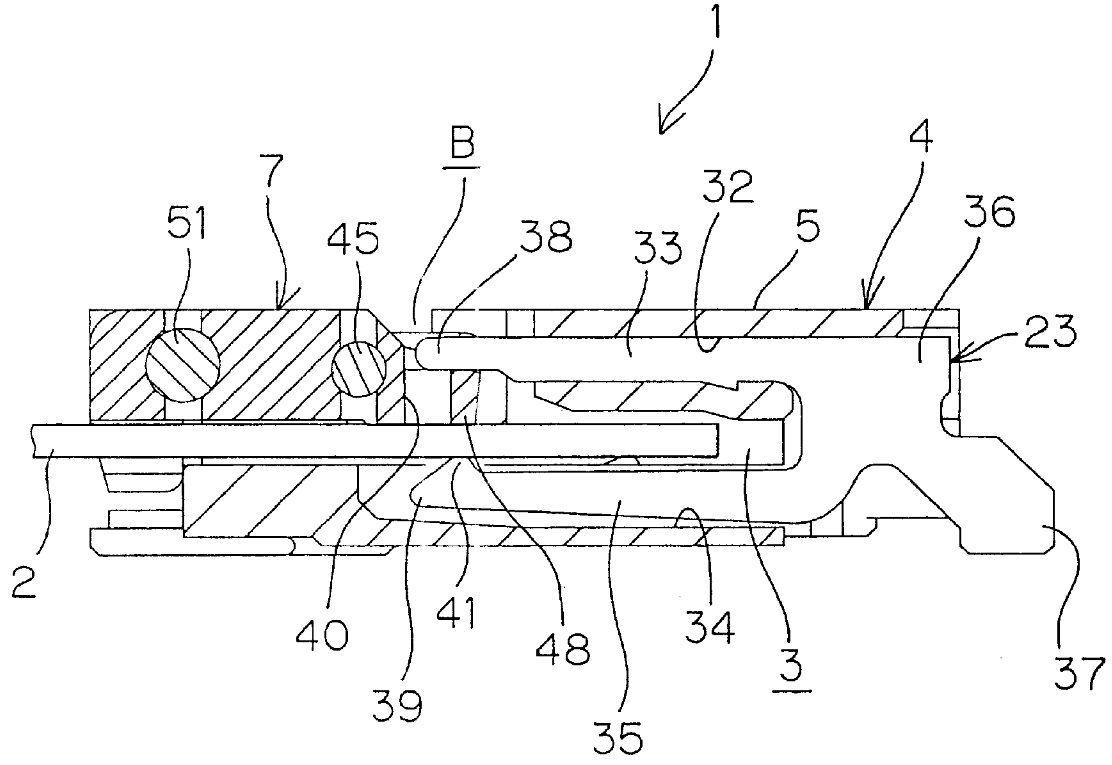
FIG. 9 is a sectional view showing the connector with the FPC connected and corresponds to FIG. 5.

Respective front ends 38, 39 of the fixing piece 33 and the resilient piece 35 reach a midportion of the housing 4 with respect to the anteroposterior direction thereof. The front end 38 of the fixing piece 33 enters an open hole 40 of the cover 7 when the cover 7 of FIG. 5 is closed. Further, the front end 38 exposes itself to the outside thereabove via an open area B defined along an edge of the cover 7 when the cover 7 is closed, as shown in FIGS. 6 and 9. Thus, the continuity test may be readily performed by bringing a continuity test probe into contact with the front end 38 of the fixing piece 33 of the second contact 23 via the open area B of the closed cover 7.

On the other hand, the front end 39 of the resilient piece 35 is formed with an upward chevron-shaped projection 41 for ensuring the contact pressure on the FPC 2.

Figure 7:
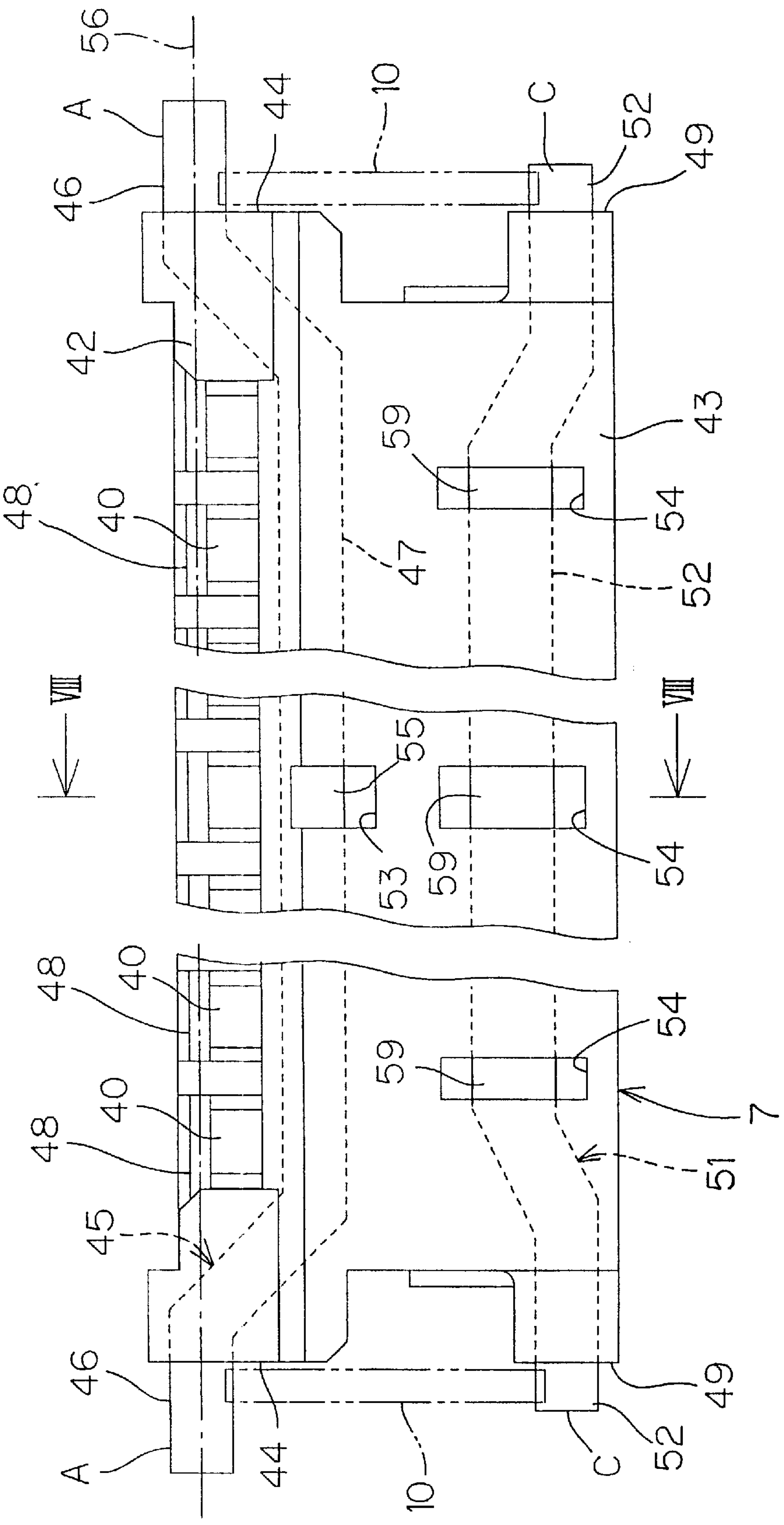
FIG. 7 is a partially cutaway plan view showing the cover.

Referring to FIGS. 1 and 7 which is a plan view of the cover, the cover 7 is of a rectangular plate, having first and second edges 42, 43 in opposed relation. The aforesaid pair of pivot shafts A project from opposite lateral ends 44, 44 of the first edge 42, respectively.

The pivot shaft pair A comprise exposed opposite ends 46, 46 of the metallic wire 45 which is embedded in the cover 7 during the molding thereof. An intermediate portion 47 of the wire 45 is substantially of a channel-form and includes a portion extended parallel to the first edge 42 and a pivotal axis 56 as spaced a distance therefrom. The whole body of the wire 45 takes on a crank form.

Along the first edge 42 of the cover 7, a plurality of open holes 40 are arranged in side-by-side relation for permitting the retractable entrance of the front ends 38 of the second contacts 23, as shown in FIG. 5. In FIG. 7, a portion closer to the first edge 42 than the open holes 40 defines a pressing portion 48.

When the cover 7 is moved to the closed position, the pressing portion 48 is clamped between the FPC 2 on the resilient piece 35 of the second contact 23 and the fixing piece 33 while pressing the FPC 2 against the resilient piece 35, as shown in FIG. 9.

Turning back to FIG. 7, the pair of locking projections C project from opposite lateral ends 49, 49 of the second edge 43 of the cover 7, respectively, so as to engage the corresponding lock notches 50 of the reinforcement tabs 10. When the cover 7 is closed, the locking projections C engage the lock notches 50 thereby to lock the cover 7 in the closed position. An arrangement is made such that when the cover 7 is closed, the pair of reinforcement tabs 10, indicated by the two-dot chain line in FIG. 7, couple the respective ends (equivalent to the pivot shafts A) of the wire member 45 with the corresponding ends (equivalent to the locking projections C) of the wire 51 as a lock shaft, for forming a rectangular closed loop of the wire 45, wire 51 and reinforcement tab pair 10, 10.

The locking projection pair C comprise exposed opposite ends 52, 52 of the metallic wire 51 which is embedded in the cover 7 during the molding thereof.

The whole body of the wire 51 take on a crank form, an intermediate portion 52 of which extends parallel to the second edge 43 as spaced a distance therefrom.

Figure 8:
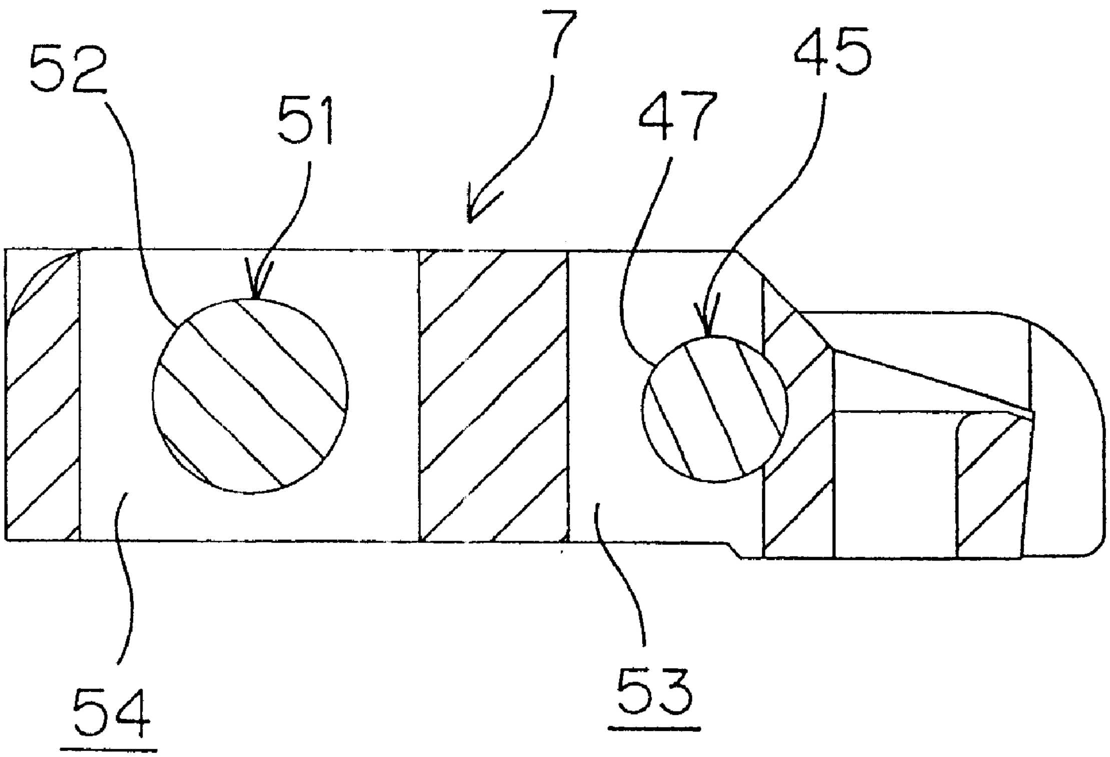
FIG. 8 is a sectional view taken on the line VIII—VIII in FIG. 7.

Referring to FIGS. 7 and 8 which is a sectional view taken on the line VIII—VIII in FIG. 7, there are provided plural openings 53 for exposing the wire 45 whereas one or more openings 54 are provided for exposing the intermediate portion of the wire 51. These openings 53, 54 play the following role. In order to insert the metallic wires 45, 51 in an article being molded for producing the cover 7 with the wires embedded therein, the metallic wires 45, 51 must be supported in a given position within a molding die. The openings 53, 54 permit wide support pins (insert pins) to be placed in the molding die at places in correspondence thereto. Thus, the wires 53, 54 may be stably supported within the molding die. As a result, the molded article has high positional accuracies for the pivot shafts A and locking projections C which are comprised of the opposite ends of the wires 45, 51, respectively.

According to the embodiment, the pivot shafts A of the cover 7 are formed of metal so as to be less prone to breakages. The deflection of the cover 7 is prevented by the metallic wire 45 extended through the width thereof (in the lateral direction) and embedded therein. Therefore, a sufficient contact pressure is ensured between the FPC 2 and the resilient pieces 35 of the second contacts 23 while the cover 7 is prevented from disengaging from the housing 4.

The deflection of the cover 7 is more positively prevented by virtue of the reinforcement wire 51 provided in addition to the wire 45. Particularly when the cover 7 is in the closed position, the pair of reinforcement tabs 10, 10, the wire 45 and the reinforcement wire 51, all formed of metal, form a substantially rectangular structure. Hence, the cover 7 is assuredly fixed to impart the connector 1 with quite high rigidity. This ensures that the FPC 2 is positively maintained in the pressed condition.

If the wire 45 extends straight through the first edge 42 of the cover 7, the edge 42 contains therein the wire 45 and hence, is increased in thickness. This also leads to an increased thickness of the pressure portion 48 disposed at the edge 42. As a result, the second contact 23 has an increased gap between the fixing piece 33 and the resilient piece 35 thereof, which results in a great height of the connector 1. In contrast, the embodiment is arranged such that the intermediate portion 47 of the wire 45 is spaced a distance from the edge 42 of the cover 7 so as to permit the reduction of the thickness of the pressure portion 48 disposed along the edge 42, as shown in FIG. 9. As a result, the connector 1 has a small height.

Figure 10A:
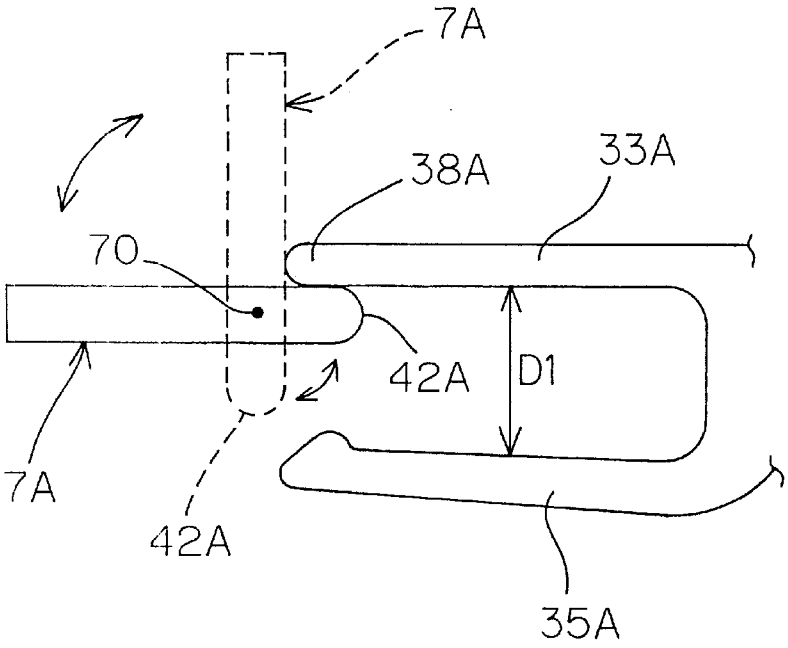
FIGS. 10A and 10B are schematic side views of the cover and contact for illustration of the height reduction of the connector, FIG. 10A being an imaginary diagram assuming that the cover has the pivotal axis spaced from one edge thereof, FIG. 10B illustrating the embodiment of the invention and omitting the hatching of an area representing the section of the cover.

If a cover 7A is constructed to have a pivot shaft 70 spaced a distance from a first edge 42A of the cover 7A, as shown in FIG. 10A, the first edge 42A pivots about the pivotal axis 70 along an arcuate line having a great radius. This results in an increased distance D1 between a fixing piece 33A and a resilient piece 35A and the connector requirement for decreased height cannot be satisfied.

Figure 10B:
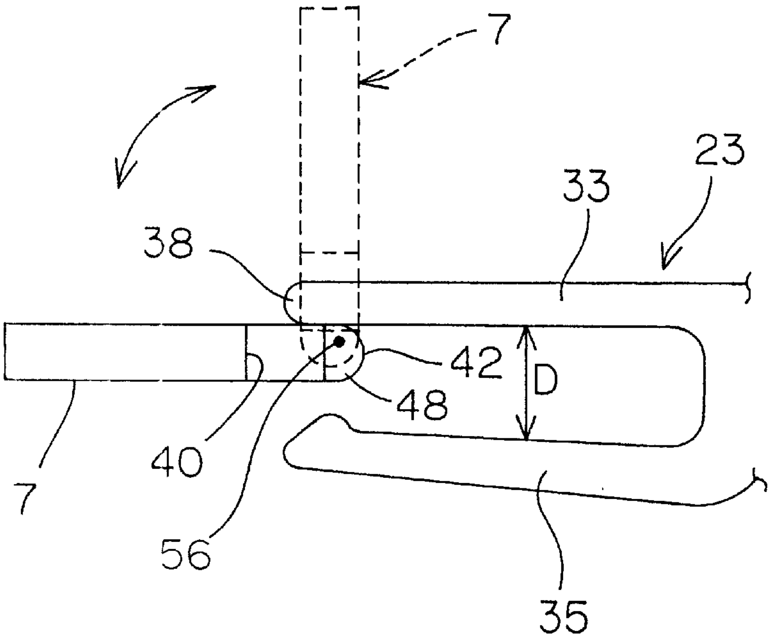

In order to achieve the height reduction, the pivotal axis 56 (corresponding to the center of the pivot shaft A) must be positioned close to the first edge 42, as shown in FIG. 10B illustrating the embodiment. In addition, the pressure portion 48 disposed along the first edge 42 must be located at place under the front end 38 of the fixing piece 33 of the second contact 23. Therefore, the pivotal axis 56 is positioned at place near a lower surface of the front end 38 of the fixing piece 33 as viewed from the side of the contact.

When the cover 7 pivots about the pivotal axis 56 as indicated by the broken line in the figure, a portion near the pressure portion 48 interferes with the front end 38 of the fixing piece 33 if the open hole 40 is not provided. In contrast, the embodiment is designed to avoid the interference between the cover 7 and the front end 38 of the fixing piece 33 by means of the open hole 40, thus accomplishing the decreased distance D between the fixing piece 33 and the resilient piece 35 for practical height reduction of the connector 1.

It is to be noted that the present invention is not limited to the above embodiment. For example, the pair of projections C may be integrally formed with the cover 7 using a resin material. It is also possible to dispense with the reinforcement wire 51 so that the cover 7 may be reinforced with the wire 45 alone.

Figure 11:
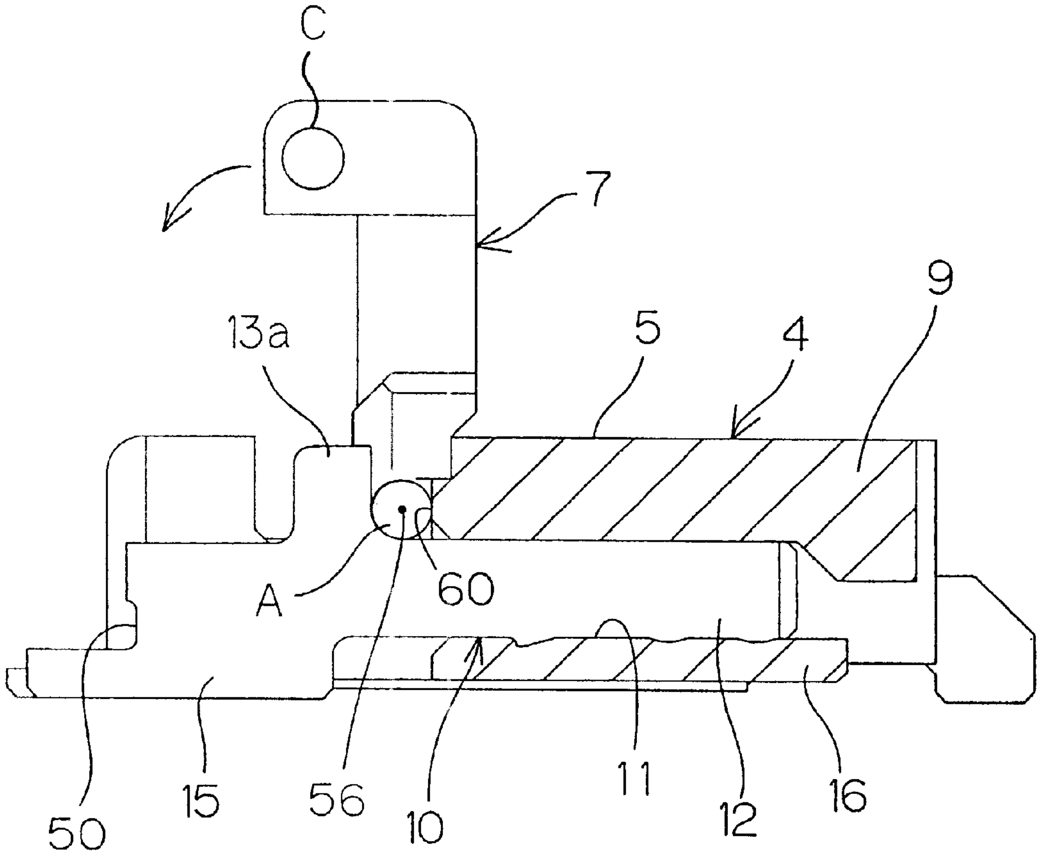
FIG. 11 is a schematic sectional view showing a connector according to another embodiment of the invention.

As shown in FIG. 11, the substantially L-shaped extension piece 13 of the reinforcement tab 10 may be replaced by a straight extension piece 13*a* extending substantially orthogonally from the main body 12. In this case, the extension piece 13*a* serves to prevent the corresponding pivot shaft A from being dislocated in a direction to draw out the flexible printed board 2 (leftward as seen in the figure).

Other various changes and modifications are possible within the scope of the invention.

What is claimed is:

1. An electrical connector for flexible printed board comprising:

a synthetic-resin housing having an opening, a plurality of fork-shaped contacts being arranged to face the opening, each of the contacts having a fixing piece and a resilient piece in vertically opposed relation, a synthetic-resin cover being rotatable around a predetermined pivotal axis to open or close the opening, a pressure portion disposed along an edge of the cover, the edge being close to the pivotal axis, the pressure portion, with the cover closed, being clamped between a flexible printed board on the resilient pieces and the fixing pieces while pressing the flexible printed board against the resilient pieces, and a metallic wire being partially embedded in the cover during the molding of the cover, wherein the wire includes a pair of opposite ends and an intermediate portion between the opposite ends, wherein the opposite ends project from lateral sides of the cover along the pivotal axis and are supported by corresponding pivotal support portions, respectively, and wherein the intermediate portion is spaced from the pivotal axis to circumvent the pressure portion and is at least partially embedded in the cover during the molding of the cover.

2. An electrical connector for flexible printed board according to claim 1, wherein the cover includes an opening for exposing a part of the intermediate portion of the wire.

3. An electrical connector for flexible printed board according to claim 1, wherein the intermediate portion of the wire is substantially of a channel form.

4. An electrical connector for flexible printed board according to claim 1, wherein the cover includes an open hole allowing retractable entrance of a front end of the fixing piece of the second contact.

5. An electrical connector for flexible printed board according to claim 1, wherein the edge of the cover is formed with an open area for partially exposing the fixing piece of the contact when the cover is closed.

6. An electrical connector for flexible printed board according to claim 1, further comprising a pair of metallic reinforcement plates fixed to the housing, the reinforcement plates including the pivotal support portions.

7. An electrical connector for flexible printed board according to claim 1, further comprising at least one metallic reinforcement wire being at least partially embedded in the cover during the molding thereof.

8. An electrical connector for flexible printed board according to claim 7, wherein the cover includes an opening for exposing a part of the reinforcement wire.

* * * * *